(12) United States Patent
Oomori

(10) Patent No.: US 8,432,223 B2
(45) Date of Patent: Apr. 30, 2013

(54) DIFFERENTIAL AMPLIFIER CIRCUIT

(75) Inventor: Tetsuo Oomori, Chiba (JP)

(73) Assignee: Lapis Semiconductor Co., Ltd. (JP)

( * ) Notice: Subject to any disclaimer, the term of this patent is extended or adjusted under 35 U.S.C. 154(b) by 0 days.

(21) Appl. No.: 13/190,719

(22) Filed: Jul. 26, 2011

(65) Prior Publication Data

US 2012/0025912 A1    Feb. 2, 2012

(30) Foreign Application Priority Data

Jul. 28, 2010  (JP) .................................. 2010-169387

(51) Int. Cl.
*H03F 3/45* (2006.01)
(52) U.S. Cl.
USPC .......................................... 330/259; 330/260
(58) Field of Classification Search ........... 330/252–261
See application file for complete search history.

(56) References Cited

U.S. PATENT DOCUMENTS

| | | | | |
|---|---|---|---|---|
| 4,599,575 A * | 7/1986 | Bernard | ......................... | 330/253 |
| 6,104,179 A * | 8/2000 | Yukawa | ......................... | 323/316 |
| 7,795,961 B2 * | 9/2010 | Kojima et al. | ................. | 330/255 |
| 7,986,188 B2 * | 7/2011 | Fujiwara | ....................... | 330/260 |

FOREIGN PATENT DOCUMENTS

| | | |
|---|---|---|
| JP | 2003-177829 A | 6/2003 |
| WO | WO-03091817 A1 | 11/2003 |

* cited by examiner

*Primary Examiner* — Khanh V Nguyen
(74) *Attorney, Agent, or Firm* — Rabin & Berdo, P.C.

(57) ABSTRACT

A differential amplifier circuit can reduce consumption current and the circuit size while improving a power supply rejection ratio. The differential amplifier circuit includes a power supply line and an input part that includes an input circuit and an active load. The input circuit includes two differential input elements, and the active load includes two transistors connected to the two differential input elements. The input part generates a differential signal in response to an input signal given to the two differential input elements. The differential amplifier circuit also includes an amplifying part for generating an output voltage generating signal by amplifying the differential signal. The differential amplifier circuit also includes an output part for generating an output voltage based on the output voltage generating signal and a power supply voltage. The differential amplifier circuit includes a noise permitting part located between control terminals of the two transistors and the power supply line.

18 Claims, 9 Drawing Sheets

FREQUENCY (Hz)

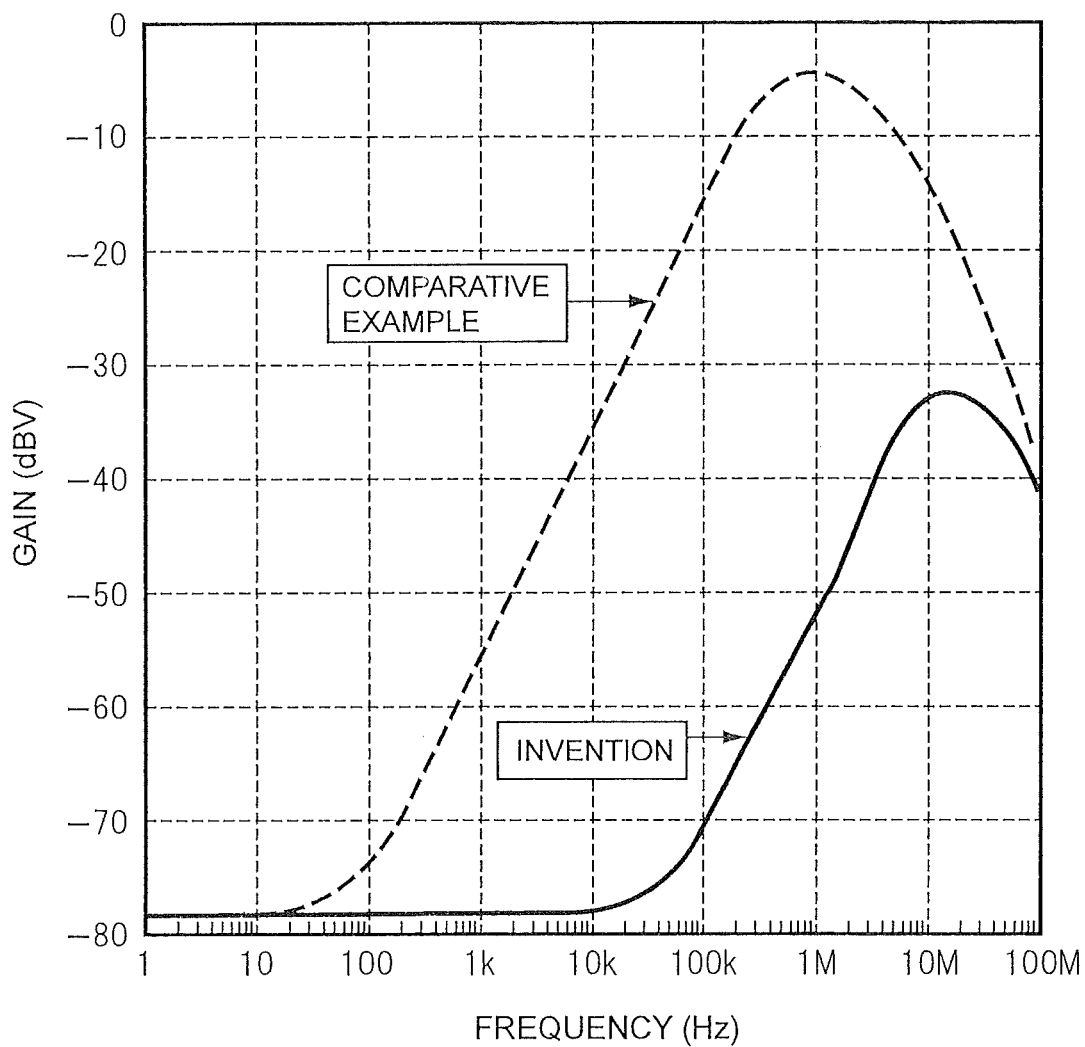

DIFFERENTIAL AMPLIFIER CIRCUIT

BACKGROUND OF THE INVENTION

1. Field of the Invention

The present invention relates to a differential amplifier circuit for supplying a certain voltage, and in particular, to a technique of improving a power supply rejection ratio of the differential amplifier circuit.

2. Description of Related Art

Known differential amplifier circuits include a so-called regulator circuit designed to compare a certain voltage derived from a power supply voltage with a reference voltage, and supply a desired constant voltage (output voltage) in accordance with a result of the comparison. Such a regulator circuit is disclosed, for example, in Japanese Patent Application Publication (Kokai) No. 2003-177829 and Japanese Patent No. 4054804 (or WO 2003/091817). In this regulator circuit, the reference voltage is supplied to the gate of one of paired differential input elements in an input circuit, and the certain voltage derived from the power supply voltage is supplied to the gate of the other of the differential input elements. Here, the certain voltage derived from the power supply voltage is a feedback output voltage negatively fed back from a power supply through an output element and a voltage divider resistor.

In the regulator circuit disclosed in Japanese Patent Application Kokai No. 2003-177829, a phase compensation circuit with a resistor and a capacitor is disposed between the other of the differential input elements of the input circuit, and the output element for supplying a constant regulator voltage (output voltage). The phase compensation circuit can suppress change of the regulator voltage that would be caused by the characteristics of the regulator circuit itself.

A power supply voltage supplied to the regulator circuit is not always constant, but it changes with a certain cycle. This results in instability of the regulator voltage, i.e., instability of the output voltage. Specifically, a noise signal of the power supply voltage reduces the power supply rejection ratio (PSSR) of the regulator circuit. One reason therefore is as follows. The certain voltage is supplied from the power supply to the gate of the other of the paired differential input elements of the input circuit after passing through the output element and the voltage divider resistor. This creates a delay due to the presence of a path (feedback line) for connecting the other of the paired differential input elements to the power supply through the output element and the voltage divider resistor. There is another reason. A certain time interval is required between supplying of the certain voltage to the gate of the other of the paired differential input elements and turning on of an active load element connected to the paired differential input elements. This creates a delay between turning on of the differential input elements and turning on of the active load element. These delays may be suppressed by increasing current flowing in the paired differential input elements to enhance the operation of the paired differential input elements. This, however, increases consumption current of the regulator circuit.

The regulator circuit disclosed in Japanese Patent No. 4054804 (WO 2003/091817) suggests a solution to the above-mentioned problems. In this regulator circuit, the gate of the other of the paired differential input elements of an input circuit receives not only a feedback output voltage negatively fed back through a voltage divider resistor, but also a cancel signal from a cancel signal generating circuit. The cancel signal is produced on the basis of the change of a power supply voltage. The cancel signal generating circuit prevents the above-described delays even when the change of the power supply voltage occurs. Thus, the regulator voltage can be supplied stably despite the change of the power supply voltage.

SUMMARY OF THE INVENTION

In the regulator circuit disclosed in Japanese Patent No. 4054804 (WO 2003/091817), a capacitor in the cancel signal generating circuit has a very small capacitance ranging from 0.001 pF to 0.1 pF. It is difficult to form a capacitor of a very small capacitance in such a range by controlling a distance between two polar plates of the capacitor, as unevenness may be inevitably included in the distance between these two polar plates. In order to ensure a very small capacitance in the above-mentioned range, trimming may be performed by adding a trimming circuit and a capacitor dedicated to the trimming. However, this hinders cost reduction and size reduction of the regulator circuit.

Use of the cancel signal generating circuit that supplies a cancel signal in accordance with the change of the power supply voltage to the gate of the other of the paired differential input elements of a differential part is applicable only to the regulator circuit. This structure is not applicable to other types of differential amplifier circuits such as a reference voltage supply circuit (band-gap reference circuit) that compares voltages in the circuit without depending on a reference voltage to generate a desired voltage.

One object of the present invention is to provide a differential amplifier circuit capable of reducing consumption current of the circuit and reducing size of the circuit while improving a power supply rejection ratio.

According to one aspect of the present invention, there is provided a differential amplifier circuit that includes a power supply line connected to a power supply voltage source. The differential amplifier circuit also includes an input part that has an input circuit and an active load. The input circuit includes two differential input elements. The active load includes two transistors connected to the two differential input elements, respectively. The input part generates a differential signal in response to an input signal given to each of the two differential input elements. The differential amplifier circuit also includes an amplifying part for generating an output voltage generating signal by amplifying the differential signal. The differential amplifier circuit also includes an output part for generating an output voltage on the basis of the output voltage generating signal supplied from the amplifying part and a power supply voltage supplied from the power supply voltage source. The differential amplifier circuit also includes a noise permitting part connected between control terminals of the two transistors and the power supply line. The noise permitting part permits only a noise component of the power supply voltage to pass.

In the differential amplifier circuit of the present invention, the noise permitting part is provided between the respective control terminals of the two transistors of the active load of the input part, and the power supply line to which the power supply voltage is applied. Thus, a noise signal based on the change of the power supply voltage is directly given to these control terminals. Accordingly, the two transistors of the active load are directly turned on by using the noise signal, and the output voltage having a constant voltage value can be supplied without being influenced by the change of the power supply voltage. This means that the differential amplifier circuit of the invention has an improved power supply rejection ratio. The provision of the noise permitting part improves a power supply rejection ratio. Accordingly, an amount of current is not required to be increased for improvement of a power supply rejection ratio. This results in reduction of consumption current of the differential amplifier circuit. Since trimming with a trimming circuit and associated parts is unnecessary, the noise permitting part can be reduced in size, and the differential amplifier circuit can be reduced in size.

These and other objects, aspects and advantages of the present invention will become apparent to those skilled in the art from the following detailed description when read and understood in conjunction with the appended claims and drawings.

BRIEF DESCRIPTION OF THE DRAWINGS

FIG. 9 shows the characteristics of the power supply rejection ratios (PSRRs) of the reference voltage supply circuit according to the second embodiment of the present invention and of the reference voltage supply circuit of Comparative Example.

DETAILED DESCRIPTION OF THE INVENTION

Embodiments of the present invention will be described in detail below with reference to the accompanying drawings.

First Embodiment

Figure 1:
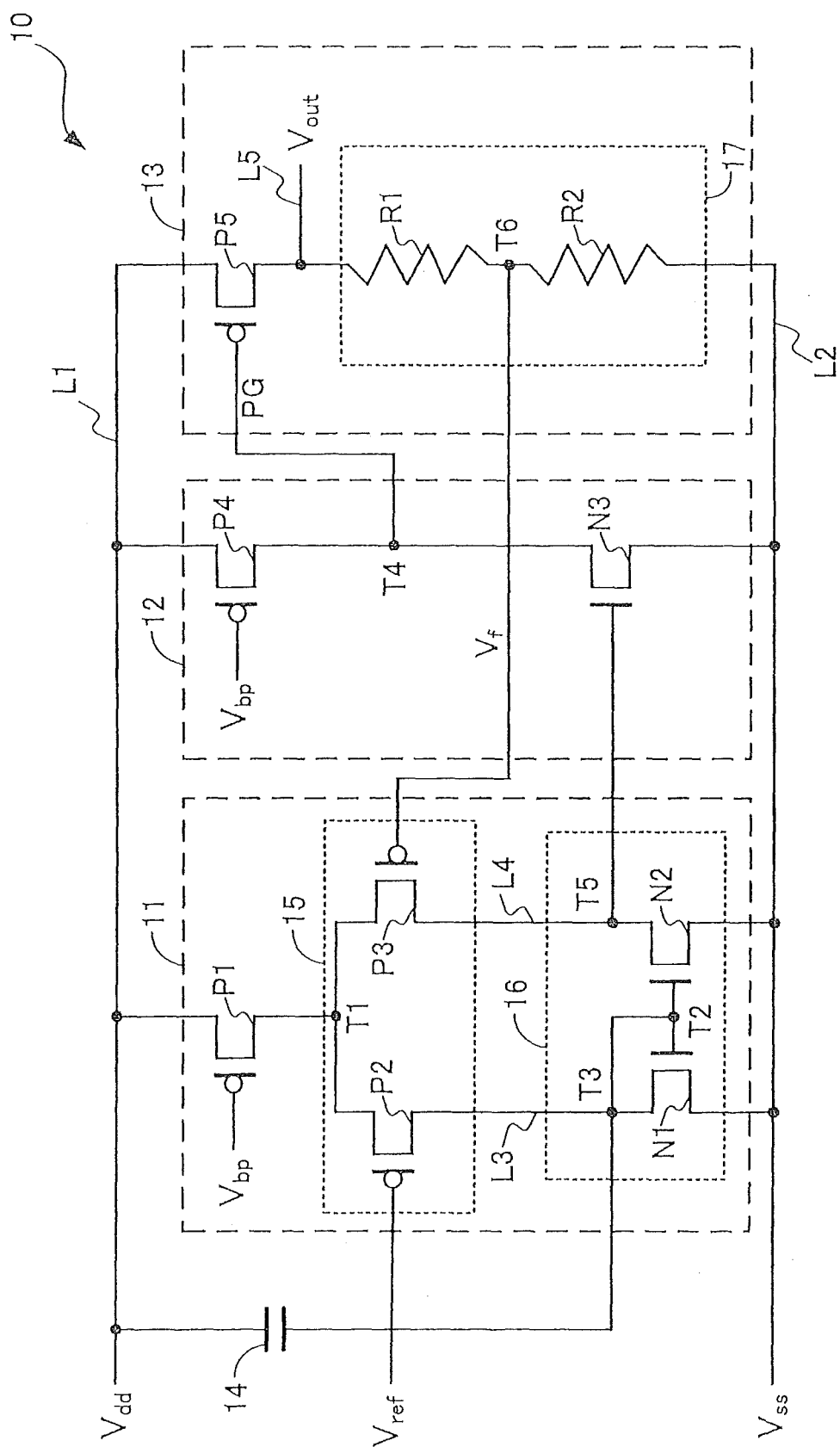
FIG. 1 is a circuit diagram showing the structure of a stabilized power supply circuit according to a first embodiment of the present invention.

First, the structure of a stabilizer power supply circuit (series regulator) 10 according to a first embodiment of the present invention will be described with reference to FIG. 1. FIG. 1 is an equivalent circuit diagram of the stabilizer power supply circuit 10. The stabilizer power supply circuit 10 is an example of a differential amplifier circuit.

As shown in FIG. 1, a stabilizer power supply circuit 10 includes a power supply line L1 to which a power supply voltage $V_{dd}$ is supplied from a direct-current power supply (i.e., power supply voltage source), a ground line L2 connected to a ground potential $V_{ss}$, an input part 11, an amplifying part 12, an output part 13, and a capacitor 14 (i.e., noise permitting part). The input part 11, the amplifying part 12, and the output part 13 are disposed between the power supply line L1 and the ground line L2. The capacitor 14 is disposed between the power supply line L1 and the input part 11.

The input part 11 includes a transistor P1 that is a p-channel MOS (metal oxide semiconductor) transistor, an input circuit 15, and an active load (current mirror load) 16. The input circuit 15 includes transistors P2 and P3 that are p-channel MOS transistors. The active load 16 includes transistors N1 and N2 that are n-channel MOS transistors.

The transistor P1 has a source terminal connected to the power supply line L1, and a drain terminal connected through a node T1 to the source terminals of the transistors P2 and P3 of the input circuit 15. The transistor P1 further has a gate terminal to receive a reference current potential $V_{bp}$ to determine an amount of reference current to flow in the input part 11.

The source terminals of the transistors P2 and P3 of the input circuit 15 are connected to each other. Both the source terminals of the transistors P2 and P3 are also connected through the node T1 to the drain of the transistor P1. The drain terminals of the transistors P2 and P3 are connected to the active load 16. The gate terminal of the transistor P3 is connected to the output part 13. A reference voltage $V_{ref}$ to determine the value of an output voltage $V_{out}$ generated by the stabilizer power supply circuit 10 is applied to the gate terminal of the transistor P2. A feedback output voltage $V_f$ is supplied from the output part 13 to the gate terminal of the transistor P3. The above-described structure and connection form the input circuit 15 in which the transistors P2 and P3 function as paired differential input elements.

The drain terminal of the transistor N1 of the active load 16 is connected to the drain terminal of the transistor P2. The drain terminal of the transistor N2 of the active load 16 is connected to the drain terminal of the transistor P3. The respective source terminals of the transistors N1 and N2 are connected to the ground line L2. The gate terminals (control terminals) of the transistors N1 and N2 are connected to each other. Both the gate terminals of the transistors N1 and N2 are also connected through nodes T2 and T3 to the drain terminal of the transistor N1. This structure of the active load 16 causes the active load 16 to function as a current mirror circuit with the transistors N1 and N2. It should be noted that the active load 16 is not necessarily composed of n-channel MOS transistors. For example, the active load 16 may be composed of bipolar transistors.

With the above-described structure of the input part 11, a current flowing into a line L3 for connecting the transistors P2 and N1, and a current flowing into a line L4 for connecting the transistors P3 and N2 are controlled such that a total amount of the currents becomes the above-mentioned amount of the reference current to flow in the input part 11. A differential signal at a level corresponding to a difference between the reference voltage $V_{ref}$ and the feedback output voltage $V_f$ is generated on the line L4. This differential signal is supplied to the amplifying part 12.

The amplifying part 12 includes a transistor P4 that is a p-channel MOS transistor, and a transistor N3 that is an n-channel MOS transistor. The transistor P4 has a source terminal connected to the power supply line L1, and a drain terminal connected through a node T4 to the drain terminal of the transistor N3. The reference current potential $V_{bp}$ is applied to the gate terminal of the transistor P4 as well as to the gate terminal of the transistor P1. The transistor N3 has a source terminal connected to the ground line L2, and a gate terminal connected through a node T5 to the respective drain terminals of the transistors P3 and N2. With this structure of the amplifying part 12, the amplifying part 12 amplifies the differential signal generated on the line L4 by a predetermined amplification factor to generate an output voltage generating signal PG, and supplies the output voltage generating signal PG through the node T4 to the gate terminal of the transistor P5 of the output part 13. The amplifying part 12 is a known amplifier circuit. Not only the above-described structure of the amplifying part 12 but also other known amplifier circuits may be used for the amplifying part 12.

The output part 13 includes an output transistor P5 that is a p-channel MOS transistor, and a voltage divider circuit 17 that has two resistors R1 and R2. The output transistor P5 has a source terminal connected to the power supply line L1, and a drain terminal connected to an output line L5 which delivers the output voltage $V_{out}$ to outside. The gate terminal of the output transistor P5 is connected through the node T4 to the respective drain terminals of the transistors P4 and N3, so that the output voltage generating signal PG is supplied to the gate terminal of the output transistor P5. One end of the resistor R1 and one end of the resistor R2 of the voltage divider circuit 17 are connected to each other through a node T6. The opposite end of the resistor R1 is connected to the drain terminal of the output transistor P5. The opposite end of the resistor R2 is connected to the ground line L2. The above-mentioned one end of each of the resistors R1 and R2 is connected through the node T6 to the gate terminal of the transistor P3.

With this structure of the output part 13, the output transistor P5 of the output part 13 generates the output voltage $V_{out}$ having a voltage value in accordance with the output voltage generating signal PG supplied from the amplifying part 12 to the gate terminal of the output transistor P5, and supplies the output voltage $V_{out}$ through the output line L5. The feedback output voltage $V_f$ expressed by Formula (1) is generated at the node T6 between the resistors R1 and R2 of the voltage divider circuit 17. The feedback output voltage $V_f$ is supplied to the gate terminal of the transistor P3 of the input circuit 15. Specifically, a feedback output signal with the feedback output voltage $V_f$ is supplied from the voltage divider circuit 17 to the gate terminal of the transistor P3 of the input circuit 15.

$$V_f = [R2/(R1+R2)] \times V_{out} \quad (1)$$

The capacitor 14 has one end connected to the power supply line L1, and the opposite end connected through the node T3 to the drain terminals of the transistors P2 and N1. The opposite end of the capacitor 14 is also connected to the gate terminals of the transistors N1 and N2 through the nodes T3 and T2. The capacitor 14 blocks a direct-current component while permitting an alternating-current component (noise signal) to pass. Accordingly, the gate terminals of the transistors N1 and N2 are insulated from the power supply line L1 in terms of direct current, while being connected to the power supply line L1 in terms of alternating current. Thus, the power supply voltage $V_{dd}$ is not supplied from the power supply line L1 to the gate terminals of the transistors N1 and N2 when the power supply voltage $V_{dd}$ is stable. When the power supply voltage $V_{dd}$ changes (fluctuates), a noise signal based on the change of the power supply voltage $V_{dd}$ is supplied from the power supply line L1 to the gate terminals of the transistors N1 and N2. As such, the capacitor 14 functions as a noise permitting part that permits only the noise signal caused by the change of the power supply voltage $V_{dd}$ to travel to the input part 11.

As described above, the capacitor 14 is located between the gate terminals of the transistors N1 and N2 of the active load 16, and the power supply line L1. This eliminates the need to wait for any current to flow into the active load 16 in response to supply of the feedback output voltage $V_f$ from the output part 13 to the input circuit 15. The transistors N1 and N2 can be directly turned on by using the noise signal caused (produced) by the change of the power supply voltage $V_{dd}$.

The capacitance of the capacitor 14 can suitably be controlled according to electrical characteristics of the power supply circuit 10 such as the output voltage $V_{out}$, the reference voltage $V_{ref}$, the amount of current flowing through the input part 11, and the power supply rejection ratio (PSSR) of the power supply circuit 10. In this embodiment, the capacitor 14 has a capacitance of 0.1 pF or larger.

It should be noted that a circuit functioning as the noise permitting part is not necessarily composed only of the capacitor 14. Alternatively this circuit may be composed of a plurality of capacitors, or a combination of capacitor(s) and resistor(s) and/or others electrical element(s).

The operation of the stabilizer power supply circuit 10 shown in FIG. 1 will now be described.

The reference current potential $V_{bp}$ is introduced to the gate terminals of the transistors P1 and P4 to turn the transistors P1 and P4 on, thereby causing a source-to-drain current to flow in the transistor P4. In response to the turning on of the transistors P1 and P4, the output voltage generating signal PG is supplied to the gate terminal of the transistor P5. The output voltage generating signal PG causes the transistor P5 to turn on, and a source-to-drain current to flow in the transistor P5. In response to the turning on of the transistor P5, a certain voltage is applied to the voltage divider circuit 17. Upon receiving the certain voltage, the voltage divider circuit 17 generates the feedback output voltage $V_f$ based on the above-mentioned certain voltage, and supplies the feedback output voltage $V_f$ to the gate terminal of the transistor P3. The reference voltage $V_{ref}$ and the feedback output voltage $V_f$ supplied to the input circuit 15 turn the transistors P2 and P3 on, thereby causing a current to flow through the lines L3 and L4. The active load 16 functions as a current mirror circuit, and accordingly it operates such that the same current flows through the lines L3 and L4. Thus, if there has been created a difference between the amounts of current flowing through the lines L3 and L4, a differential signal responsive to the difference is generated on the line L4. The generated differential signal is supplied to the gate terminal of the transistor N3 of the amplifying part 12. The transistor N3 is turned on if the voltage value of the differential signal is greater than that of a threshold voltage $V_{th}$ of the transistor N3. Upon turning on of the transistor N3, a potential ($V_{T4}$) fluctuation at the node T4 alters the voltage value of the output voltage generating signal PG. The change of the voltage value of the output voltage generating signal PG causes the source-to-drain voltage of the transistor P5 to change. Accordingly, the desired output voltage $V_{out}$ corresponding to the reference voltage $V_{ref}$ is sent to the output line L5. The output voltage $V_{out}$ is thereafter kept constant as long as the power supply voltage $V_{dd}$ does not change (i.e., as long as a noise signal is not generated). No difference between the amounts of current flowing through the lines L3 and L4, or the voltage value of the differential signal smaller than that of the threshold voltage $V_{th}$ of the transistor N3 means that the desired output voltage $V_{out}$ corresponding to the reference voltage $V_{ref}$ has already been sent to the output line L5. Accordingly, in either case, the voltage value of the output voltage generating signal PG does not change.

The value of voltage supplied to the source terminal of the transistor P5 changes if the power supply voltage $V_{dd}$ changes (i.e., if a noise signal is generated). This in turn changes the source-to-drain voltage of the transistor P5. If the power supply voltage $V_{dd}$ changes, a noise signal based on the change of the power supply voltage $V_{dd}$ is supplied from the power supply line L1 to the gate terminals of the transistors N1 and N2 through the capacitor 14. The gate-to-source voltages of the transistors N1 and N2 change in response to the supply of the noise signal. This then changes the amounts of current flowing through the lines L3 and L4. Change of the amount of current flowing through the line L4 generates a differential signal on the line L4, and the generated differential signal is supplied to the gate terminal of the transistor N3. The potential at the node T4 changes in response to the supply of the differential signal. This in turn changes the voltage value of the output voltage generating signal PG. The change of the voltage value of the output voltage generating signal PG changes the gate-to-drain voltage of the transistor P5. As described above, the transistors N1 and N2 are directly turned on by using the noise signal based on the change of the power supply voltage $V_{dd}$. Accordingly, the change of the source-to-drain voltage matches, in phase, the change of the gate-to-drain voltage of the transistor P5. This means that the change of the source-to-drain voltage coincides with the change of the gate-to-drain voltage. The relative ratios of the voltage at the gate terminal to the voltages at the drain and source terminals do not change. Thus, the voltage applied to the gate terminal does not change if considered in a relative manner. The output voltage $V_{out}$ does not change even if the absolute value of the voltage applied to the gate terminal changes. As a result, the power supply rejection ratio of the stabilizer power supply circuit 10 is improved.

In the stabilizer power supply circuit 10 of the first embodiment, the noise permitting part composed of the capacitor 14 is disposed between the respective gate terminals (control terminals) of the two transistors N1 and N2 of the active load 16 of the input part 11, and the power supply line L1 to which the power supply voltage $V_{dd}$ is supplied. Thus, the transistors N1 and N2 can be directly turned on by using a noise signal based on the change of the power supply voltage $V_{dd}$. Therefore, the output voltage $V_{out}$ having a constant voltage value can be supplied without being influenced by the change of the power supply voltage $V_{dd}$. This means that the stabilizer power supply circuit 10 has an improved power supply rejection ratio. Since the provision of the capacitor 14 improves a power supply rejection ratio, the amount of current in the input part 11 is not required to be increased for improvement of a power supply rejection ratio. This results in reduction of consumption current of the stabilizer power supply circuit 10. Since the capacitor 14 has a capacitance of 0.1 pF or larger, variations that are inevitably included in a distance between polar plates of the capacitor during manufacturing of the capacitor are suppressed. This eliminates the need to perform trimming by using a trimming circuit and another capacitor dedicated to the trimming. This in turn results in size reduction of the stabilizer power supply circuit 10.

Second Embodiment

Figure 2:
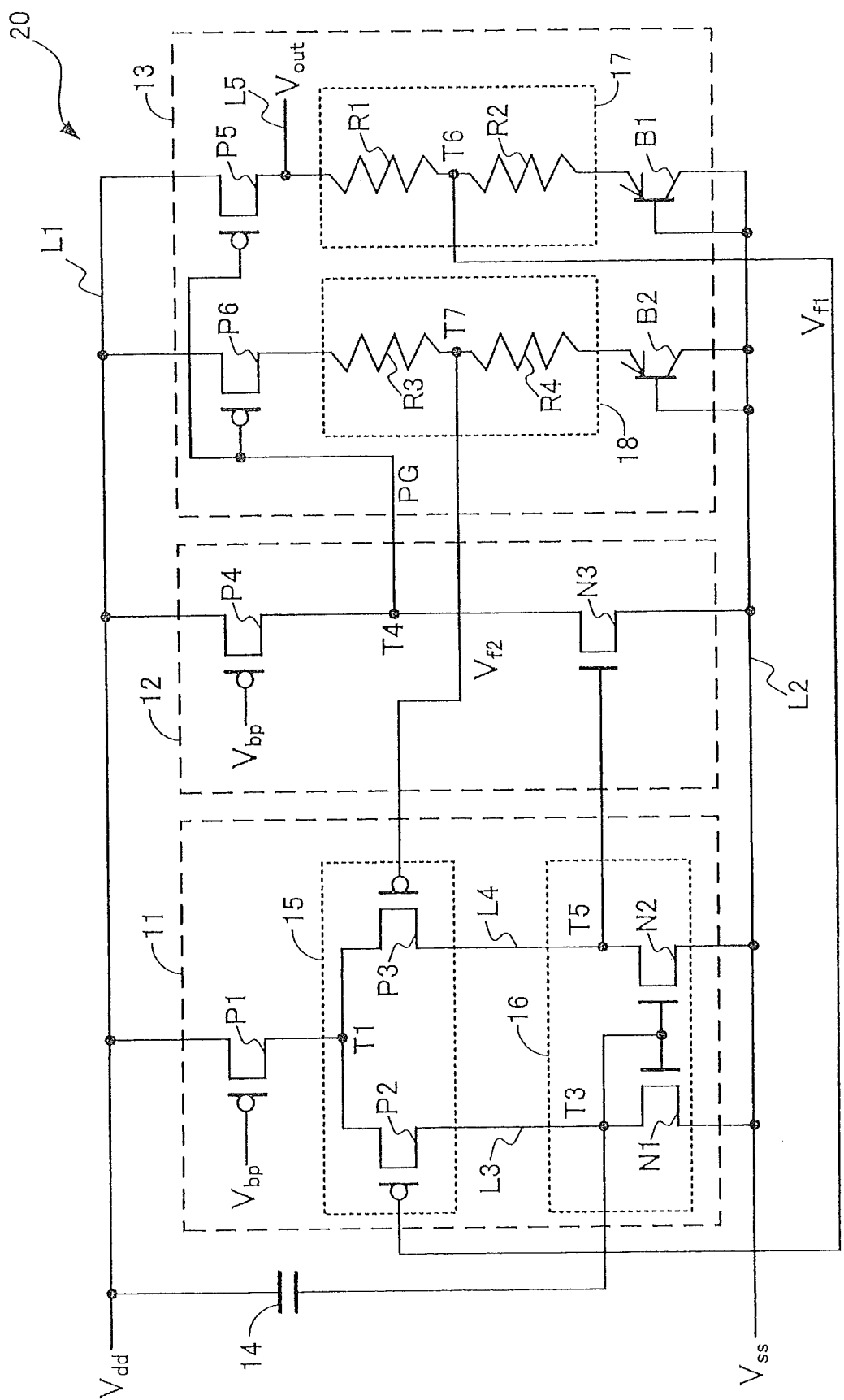
FIG. 2 shows the structure of a reference voltage supply circuit according to a second embodiment of the present invention.

The structure of a reference voltage supply circuit (bandgap reference circuit) 20 according to a second embodiment of the present invention is described by referring to FIG. 2. FIG. 2 is an equivalent circuit diagram of the reference voltage supply circuit 20. Similar reference numerals and symbols are used to designate similar elements and actions in the first and second embodiments. The reference voltage supply circuit 20 is an example of a differential amplifier circuit.

Like the power supply circuit 10 of the first embodiment, the reference voltage supply circuit 20 includes a power supply line L1 to which a power supply voltage $V_{dd}$ is supplied from a direct-current power supply, a ground line L2 connected to a ground potential $V_{ss}$, an input part 11, an amplifying part 12, an output part 13, and a capacitor 14 functioning as a noise permitting part. In the following description, parts and elements different from those of the power supply circuit 10 of the first embodiment are described, and the same structures are not described.

The output part 13 of the reference voltage supply circuit 20 includes an output transistor P5, another output transistor P6 that is a p-channel MOS transistor, a voltage divider circuit 17, a voltage divider circuit 18 with two resistors R3 and R4, and transistors B1 and B2 that are PNP bipolar transistors.

The output transistor P6 has a source terminal connected to the power supply line L1, and a drain terminal connected to the voltage divider circuit 18. The drain terminals of the transistors P4 and N3 are connected through a node T4 to the gate terminal of the output transistor P6. Accordingly, an output voltage generating signal PG is supplied to the gate terminal of the output transistor P6 as well as to the transistor P5. One end of a resistor R1 and one end of a resistor R2 of the voltage divider circuit 17 are connected to each other through a node T6. The opposite end of the resistor R1 is connected to the drain terminal of the output transistor P5. The opposite end of the resistor R2 is connected to the emitter terminal of the transistor B1. The above-mentioned one end of each of the resistors R1 and R2 is connected through the node T6 to the gate terminal of the transistor P2. One end of the resistor R3 and one end of the resistor R4 of the voltage divider circuit 18 are connected to each other through a node T7. The opposite end of the resistor R3 is connected to the drain terminal of the output transistor P6. The opposite end of the resistor R4 is connected to the emitter of the transistor B2. The above-mentioned one end of each of the resistors R3 and R4 is connected through the node T7 to the gate terminal of the transistor P3. The transistor B1 has an emitter terminal connected to the opposite end of the resistor R2, and connector and base terminals connected to the ground line L2. The transistor B2 has an emitter terminal connected to the opposite end of the resistor R4, and connector and base terminals connected to the ground line L2. It should be noted that the transistors B1 and B2 may be replaced by diodes if appropriate characteristics such as temperature characteristics can be ensured electrically.

The amplifying part 12, the structure of which is the same as the amplifying part of the first embodiment, is composed of a known amplifier circuit. Not only the above-described structure of the amplifying part 12 but also other known amplifier circuits can be used for the amplifying part 12. The output part 13 is composed of a known output circuit. Not only the above-described structure of the output part 13 but also other known output circuits can be used for the output part 13.

In the above-described structure, the resistors R1, R2, R3 and R4 have different resistances, and the transistors B1 and B2 have different electrical characteristics. The resistances of the resistors of the voltage divider circuits, and the characteristics of the transistors P5 and P6 are determined such that the nodes T6 and T7 have different voltage values even if the drain terminals of the transistors P5 and P6 have the same voltage value. This structure makes a first feedback output voltage $V_{f1}$ applied to the gate terminal of the transistor P2 from the node T6 be different from a second feedback output voltage $V_{f2}$ applied to the gate terminal of the transistor P3 from the node T7. The input part 11 compares the first and second feedback output voltages $V_{f1}$ and $V_{f2}$ to calculate a difference between these two voltages and supplies a differential signal based on this difference to the gate terminal of the transistor N3. That is, the reference voltage supply circuit 20 can generate a desired voltage in the circuit by suitably controlling the resistances of the resistors of the voltage divider circuits 17 and 18, and by controlling the characteristics of the transistors B1 and B2. The reference voltage supply circuit 20 can therefore produce the desired voltage, which is an output voltage $V_{out}$.

The location and connection of the capacitor 14 that functions as a noise permitting part, and the function of the capacitor 14 are the same as those in the first embodiment. Thus the capacitor 14 is not described here. In the reference voltage supply circuit 20 of the second embodiment, the noise permitting part or the capacitor 14 is disposed between the respective gate terminals (control terminals) of two transistors N1 and N2 of an active load 16 of the input part 11, and the power supply line L1 to which the power supply voltage $V_{dd}$ is supplied. Thus, the transistors N1 and N2 are directly turned on by using a noise signal based on the change of the power supply voltage $V_{dd}$. Accordingly, the output voltage $V_{out}$ having a constant voltage value can be supplied without being influenced by the change of the power supply voltage $V_{dd}$. This means that the power supply rejection ratio of the reference voltage supply circuit 20 is improved. The provision of the capacitor 14 improves a power supply rejection ratio. Accordingly, the amount of current in the input part 11 is not required to be increased for improvement of a power supply rejection ratio. This results in reduction of consumption current of the reference voltage supply circuit 20. Because the capacitor 14 has a capacitance of 0.1 pF or greater, variations that are inevitably included in a distance between polar plates of the capacitor 14 during manufacturing of the capacitor 14 are suppressed. This eliminates the need to perform trimming by using a trimming circuit and another capacitor dedicated to the trimming. This in turn achieves size reduction of the reference voltage supply circuit 20.

In the second embodiment, the voltage divider circuits 17 and 18 are connected to the separate output transistors P5 and P6, respectively. Alternatively the voltage divider circuit 18 may be connected to the transistor P5 such that the voltage divider circuit 18 may be connected in parallel with the voltage divider circuit 17. This eliminates the need to provide the transistor P6. In this configuration, the voltage divider circuit 18 divides a voltage supplied from the transistor P5, and then supplies the second feedback output voltage $V_{f2}$ to the gate terminal of the transistor P3. Also, the transistor B2 is connected to the resistor R4.

Third Embodiment

Figure 3:
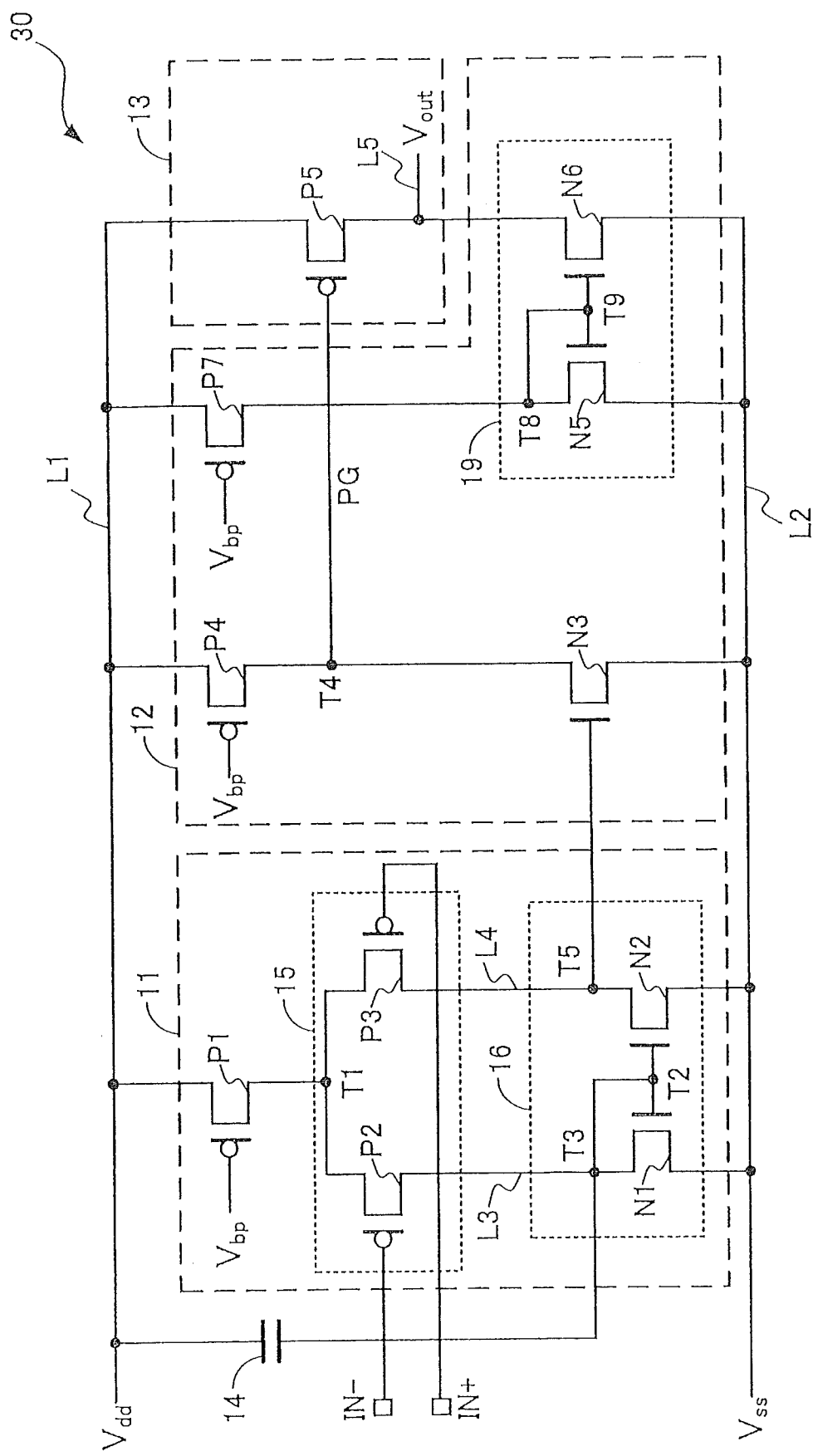
FIG. 3 is a circuit diagram showing the structure of an operational amplifier according to a third embodiment of the present invention.

The structure of a differential amplifier circuit 30 according to a third embodiment of the present invention will be described with reference to FIG. 3. FIG. 3 is an equivalent circuit diagram of the differential amplifier circuit 30. Similar reference numerals and symbols are used to designate similar elements and actions in the first, second and third embodiments. An operational amplifier is used as an example of the differential amplifier circuit 30.

Like the power supply circuit 10 of the first embodiment, the operational amplifier (or differential amplifier circuit) 30 includes a power supply line L1 to which a power supply voltage $V_{dd}$ is supplied from a direct-current power supply, a ground line L2 connected to a ground potential $V_{ss}$, an input part 11, an amplifying part 12, an output part 13, and a capacitor 14 functioning as a noise permitting part. In the following description, parts different from those of the stabilizer power supply circuit 10 of the first embodiment will be described, and the same structures are not described.

Gate signals are supplied from outside to the gate terminals of transistors P2 and P3 in an input circuit 15 of the input part 11. More specifically, an inverting input terminal (terminal IN−) is connected to the gate terminal of the transistor P2. A non-inverting input terminal (terminal IN+) is connected to the gate terminal of the transistor P3.

The amplifying part 12 of the operational amplifier 30 includes transistors P4, P7 and N3 and a constant current circuit 19. The transistor P7 is a p-channel MOS transistor.

The transistor P7 has a source terminal connected to the power supply line L1, and a drain terminal connected to the constant current circuit 19. A reference current potential $V_{bp}$ is applied to the gate terminal of the transistor P7 as well as to the gate terminals of transistors P1 and P4.

The constant current circuit 19 includes transistors N5 and N6 that are n-channel MOS transistors. The drain terminal of the transistor N5 of the constant current circuit 19 is connected to the drain terminal of the transistor P7. The drain terminal of the transistor N6 of the constant current circuit 19 is connected to the drain terminal of the transistor P5. The respective source terminals of the transistors N5 and N6 are connected to the ground line L2. The respective gate terminals of the transistors N5 and N6 are connected to each other. Both the gate terminals of the transistors N5 and N6 are also connected through a node T8 to the drain terminal of the transistor N5. This structure of the constant current circuit 19 causes (or allows) the constant current circuit 19 to function as a current mirror circuit with the transistors N5 and N6.

The amplifying part 12 with the above-described structure amplifies a differential signal generated on a line L4 by a predetermined amplification factor to generate an output voltage generating signal PG, and supplies the output voltage generating signal PG through a node T4 to the gate terminal of the transistor P5 of the output part 13.

The operational amplifier 30 with the above-described structure can generate a desired output voltage $V_{out}$ in response to the gate signals supplied from the inverting and non-inverting input terminals, and supply the output voltage $V_{out}$ through an output line L5.

The amplifying part 12 of the third embodiment is composed of a known amplifier circuit. Not only the above-described structure of the amplifying part 12 but also other known amplifier circuits may be used as the amplifying part 12. The output part 13 is composed of a known output circuit. Not only the above-described structure of the output part 13 but also other known output circuits may be used as the output part 13. For example, the output part 13 may be composed of the transistors N5 and N6.

In the operational amplifier 30 of the third embodiment, a noise permitting part having the capacitor 14 is located between the respective gate terminals (control terminals) of two transistors N1 and N2 of an active load 16 of the input part 11, and the power supply line L1 to which the power supply voltage $V_{dd}$ is supplied. Thus, the transistors N1 and N2 can be directly turned on by using a noise signal based on the change of the power supply voltage $V_{dd}$. Therefore, the output voltage $V_{out}$ having a constant voltage value can be supplied without being influenced by the change of the power supply voltage $V_{dd}$. This means that the operational amplifier 30 of the invention has an improved power supply rejection ratio. The provision of the capacitor 14 improves a power supply rejection ratio. Accordingly, the amount of current in the input part 11 is not required to be increased for improvement of a power supply rejection ratio. This results in reduction of consumption current of the operational amplifier 30. The capacitor 14 has a capacitance of 0.1 pF or greater. Accordingly, variations that are inevitably included in a distance between polar plates of the capacitor during manufacturing of the capacitor are suppressed. This eliminates the need to perform trimming by using a trimming circuit and another capacitor dedicated to the trimming, so that size reduction of the operational amplifier 30 is realized.

Figure 4:
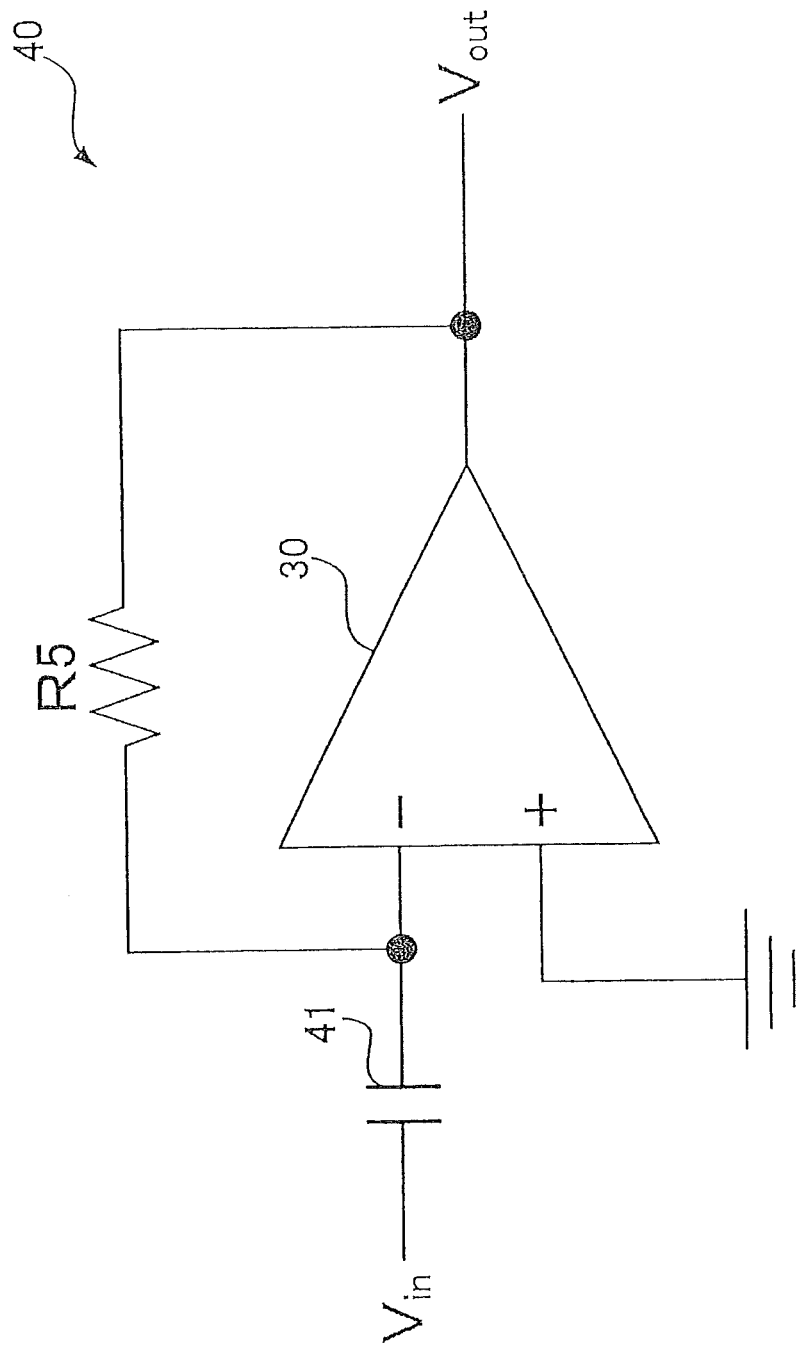
FIG. 4 is a circuit diagram showing a differentiating circuit that employs the operational amplifier according to the third embodiment of the present invention.

Exemplary use of the operational amplifier 30 according to the third embodiment will be described below with reference to FIG. 4. FIG. 4 shows a differentiating circuit 40 that employs the operational amplifier 30 of the third embodiment. As shown in FIG. 4, the differentiating circuit 40 includes the operational amplifier 30, a resistor R5, and a capacitor 41. The inverting input terminal of the operational amplifier 30 is connected to the capacitor 41. The inverting input terminal of the operational amplifier 30 is also connected to the output terminal of the operational amplifier 30 through the resistor R5. The non-inverting input terminal of the operational amplifier 30 is connected to a ground potential.

A negative feedback circuit for receiving, at its inverting input terminal, the output voltage $V_{out}$ through the resistor R5 is provided in the differentiating circuit 40. Accordingly, a noise of the power supply voltage $V_{dd}$ may lead to a delay due to the negative feedback circuit, and this may make the output voltage $V_{out}$ unstable. Like the stabilizer power supply circuit 10 of the first embodiment and the reference voltage supply circuit 20 of the second embodiment, the operational amplifier 30 of the third embodiment includes the capacitor 14 between the power supply line L1 and the active load 16. Accordingly, the active load 16 is driven in response to a noise signal of the power supply voltage $V_{dd}$ to generate a new differential signal on the line L4. As a result, the output voltage $V_{out}$ is supplied stably even if the negative feedback circuit is connected to the operational amplifier 30.

It should be noted that the operational amplifier 30 of the third embodiment achieves the above-described advantages when it is applied to the differentiating circuit 40 and also when it is applied to different circuits such as non-inverting amplifier circuits, inverting amplifier circuits, integrating circuits, and adding circuits.

Fourth Embodiment

The structure of a differential amplifier circuit according to a fourth embodiment of the present invention will be described with reference to FIG. 5. This drawing is an equivalent circuit diagram of the differential amplifier circuit according to the fourth embodiment. Similar reference numerals and symbols are used to designate similar elements and actions in the first, second, third and fourth embodiments. In this embodiment, a stabilizer power supply circuit is an example of the differential amplifier circuit.

Figure 5:
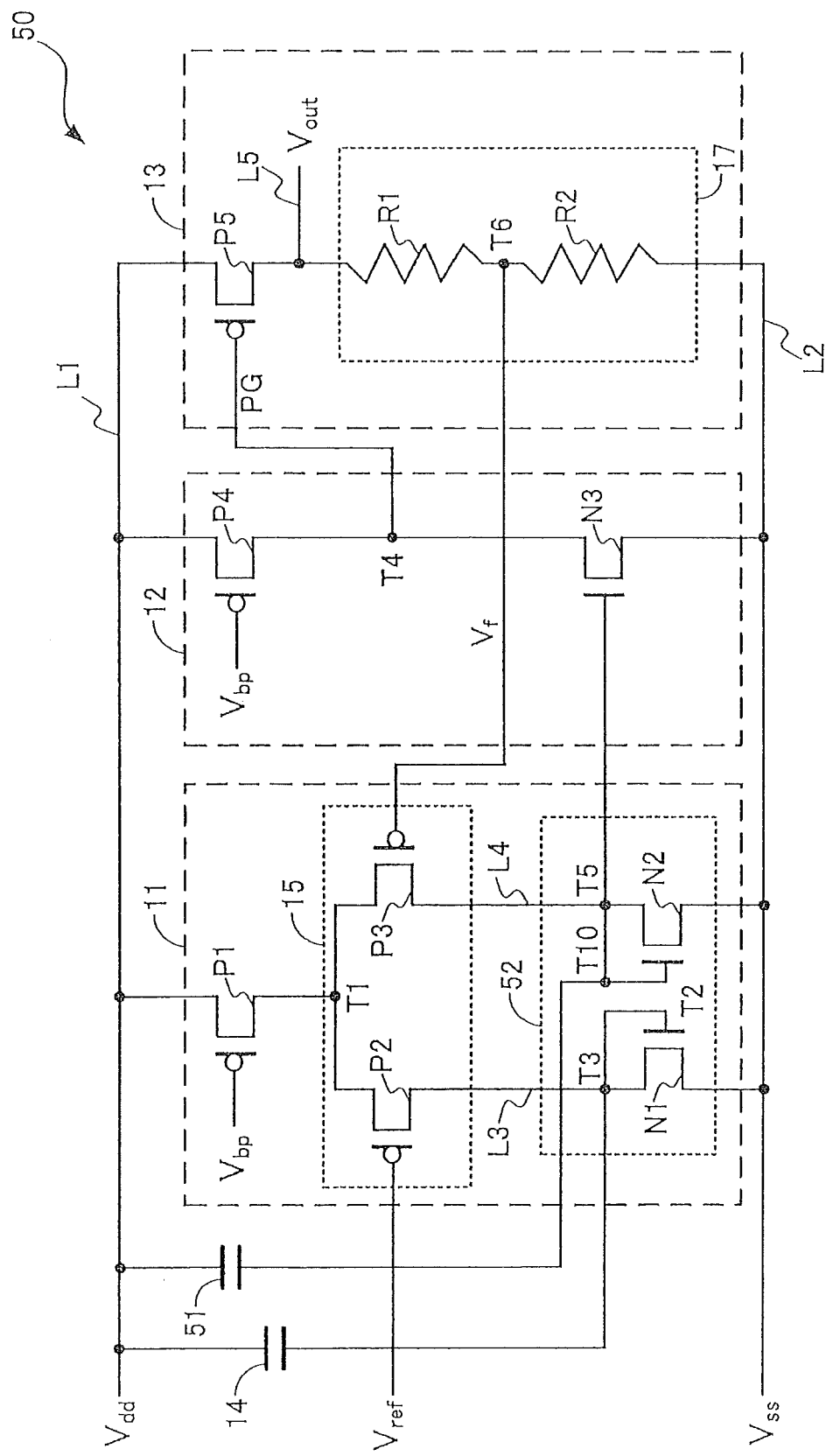
FIG. 5 is a circuit diagram showing the structure of a stabilized power supply circuit according to a fourth embodiment of the present invention.

As shown in FIG. 5, like the stabilizer power supply circuit 10 of the first embodiment, a power supply circuit 50 includes a power supply line L1 to which a power supply voltage $V_{dd}$ is supplied from a direct-current power supply, a ground line L2 connected to a ground potential $V_{ss}$, an input part 11, an amplifying part 12, an output part 13, and capacitors 14 and 15. These capacitors 14 and 15 serve in combination as a noise permitting part. In the following description, parts different from those of the stabilizer power supply circuit 10 according to the first embodiment will be described, and the same structures are not described.

Like the active load 16 of the first embodiment, an active load 52 of the input part 11 in the stabilizer power supply circuit 50 includes transistors N1 and N2. The drain terminal of the transistor N1 of the active load 52 is connected to the drain terminal of the transistor P2. The drain terminal of the transistor N2 of the active load 52 is connected to the drain terminal of the transistor P3. The respective source terminals of the transistors N1 and N2 are connected to the ground line L2. The gate terminal of the transistor N1 is connected through a node T3 to the drain terminals of the transistors N1 and P2, and to the capacitor 14. The gate terminal of the transistor N2 is connected to the drain terminals of transistors N2 and P3 through nodes T5 and T10, and to the capacitor 51 through the node T10.

The capacitor 14 has one end connected to the power supply line L1, and the opposite end connected through the node T3 to the gate terminal of the transistor N1. The capacitor 51 has one end connected to the power supply line L1, and the opposite end connected through the node T10 to the gate terminal of the transistor N2. The capacitor 51 has the same capacitance (of 0.1 pF or larger, for example) as the capacitor 14, and have the same size and electrical characteristics as those of the capacitor 14. Like the capacitor 14, the capacitor 51 blocks a direct-current component while permitting an alternating-current component to pass. Accordingly, the gate terminal of the transistor N2 is insulated from the power supply line L1 in terms of direct current, while being connected to the power supply line L1 in terms of alternating current. Thus, the power supply voltage $V_{dd}$ is not supplied from the power supply line L1 to the gate terminals of the transistors N1 and N2 when the power supply voltage $V_{dd}$ is stable. However, when the power supply voltage $V_{dd}$ changes, a noise signal based on the change of the power supply voltage $V_{dd}$ is supplied from the power supply line L1 to the gate terminals of the transistors N1 and N2 through the capacitors 14 and 51. That is, the capacitors 14 and 51 form a noise permitting part that permits only the noise signal based on the change of the power supply voltage $V_{dd}$ to pass to travel to the input part 11.

As described above, the capacitors 14 and 51 are provided between the gate terminals of the transistors N1 and N2 of the active load 52, and the power supply line L1. This eliminates the need to wait for any current to flow into the active load 52 in response to supply of a feedback output voltage $V_f$ from the output part 13 to the input circuit 15. Rather, the transistors N1 and N2 are directly turned on by using a noise signal based on the change of the power supply voltage $V_{dd}$. The capacitors 14 and 52 have the same capacitance, size, and electrical characteristics, so that the transistors N1 and N2 can be turned on simultaneously.

Comparison and Evaluation

The characteristics of the reference voltage supply circuit 20 according to the second embodiment of the present invention, and those of a reference voltage supply circuit of Comparative Example are compared with reference to FIGS. 6A to 6F, FIGS. 7A and 7B, FIGS. 8A and 8B, and FIG. 9. The reference voltage supply circuit of Comparative Example does not include the capacitor 14 of the reference voltage supply circuit 20. The structure of the reference voltage supply circuit of Comparative Example is the same as the reference voltage supply circuit 20 of the second embodiment in other respects.

Figure 6A:
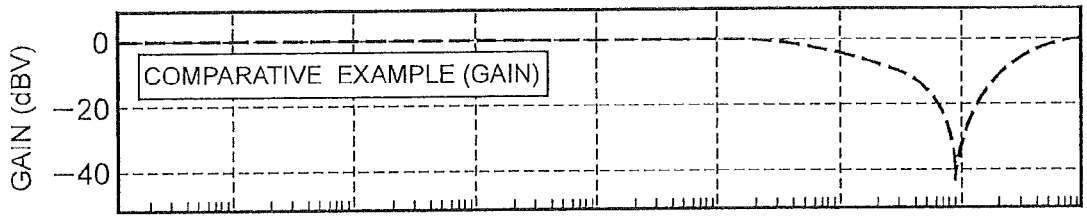
FIGS. 6A to 6F illustrate simulations conducted to obtain gains and phases with respect to the frequencies of the change of a power supply voltage in the reference voltage supply circuit according to the second embodiment of the present invention and in a reference voltage supply circuit of Comparative Example.
Figure 6B:
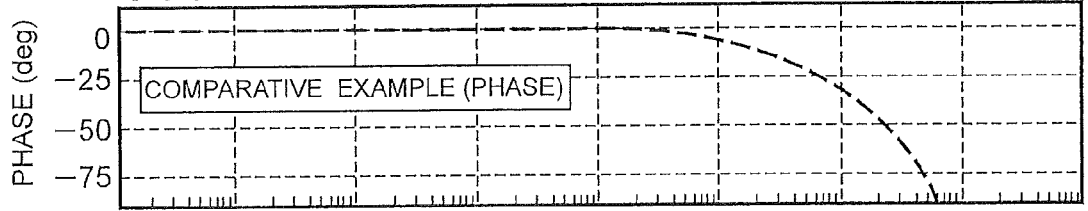
Figure 6C:
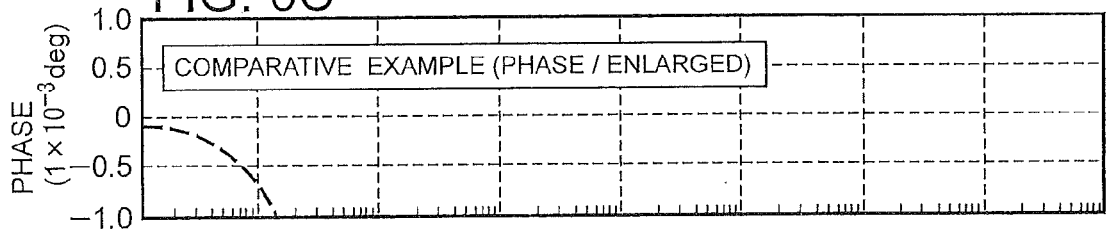
Figure 6D:
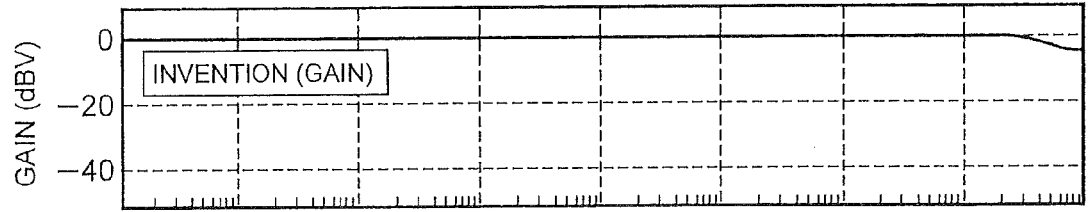
Figure 6E:
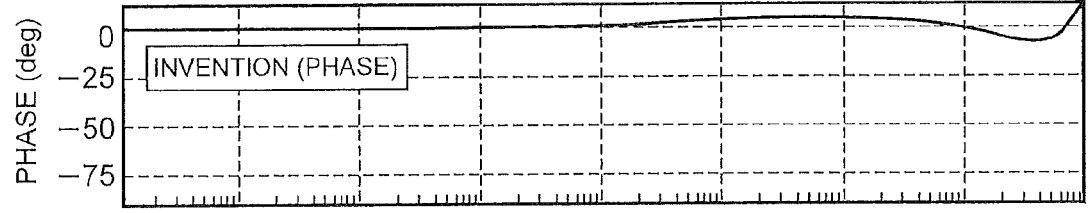
Figure 6F:
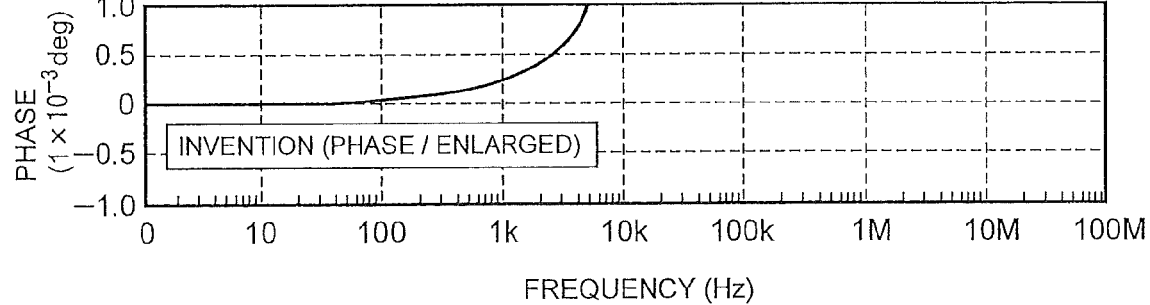

FIGS. 6A to 6F show results of simulations conducted to obtain gains and phases with respect to the frequencies of the change of a power supply voltage in the reference voltage supply circuit 20 and in the reference voltage supply circuit of Comparative Example. In each of FIGS. 6A to 6F, the horizontal axis indicates frequencies (Hz) and the vertical axis indicates gains (dBV) or phases (deg). The horizontal axis is plotted on a logarithmic scale. FIGS. 6A to 6C show the characteristics of Comparative Example, whereas FIGS. 6D to 6F show the characteristics of the reference voltage supply circuit 20 of the second embodiment. FIG. 6C is drawn by scaling up the vertical axis of FIG. 6B, and FIG. 6F is drawn by scaling up the vertical axis of FIG. 6E.

Firstly FIGS. 6A and 6D are compared. A gain significantly drops at about 10 MHz in Comparative Example while a gain slightly decreases at 50 MHz or higher frequencies in the reference voltage supply circuit 20 according to the second embodiment.

Comparison between FIGS. 6B and 6E reveals that a phase delays significantly at 100 kHz or higher frequencies in Comparative Example. In the reference voltage supply circuit 20 according to the second embodiment, substantially no phase delay was recognized at frequencies lower than 10 MHz, and only a phase delay of about 10 degrees was recognized at 10 MHz or higher frequencies. In particular, in Comparative Example, a phase delay of about 30 degrees was recognized at 1 MHz, and a phase delay of about 85 degrees was recognized at 7 MHz.

It is understood from FIGS. 6C and 6F that a phase delay was recognized even in a low-frequency region (10 kHz or lower frequencies) whereas no phase delay was recognized in the reference voltage supply circuit 20. One reason why a phase delay is generated even in a low-frequency region in Comparative Example is because the active load 16 is turned on after the input circuit 15 is turned on in response to the first and second feedback output voltages $V_{f1}$ and $V_{f2}$ applied from the voltage divider circuits 17 and 18, respectively. Specifically, the output voltage $V_{out}$ of Comparative Example is subjected to delay even in a low-frequency region due to the presence of a feedback line that supplies a gate signal to the input circuit 15. In contrast, in the reference voltage supply circuit 20 of the second embodiment, the power supply line L1 is connected through the capacitor 14 to the gate terminals of the transistors N1 and N2 of the active load 16. Accordingly, when the change of the power supply voltage $V_{dd}$ occurs, a noise signal based on the change of the power supply voltage $V_{dd}$ is supplied from the power supply line L1 to the gate terminals of the transistors N1 and N2 through the capacitor 14. Thus, the reference voltage supply circuit 20 of the second embodiment is not influenced by the delay due to the feedback line when the transistors N1 and N2 are turned on. This may be the reason why the output voltage $V_{out}$ is not subjected to phase delay.

Figure 7A:
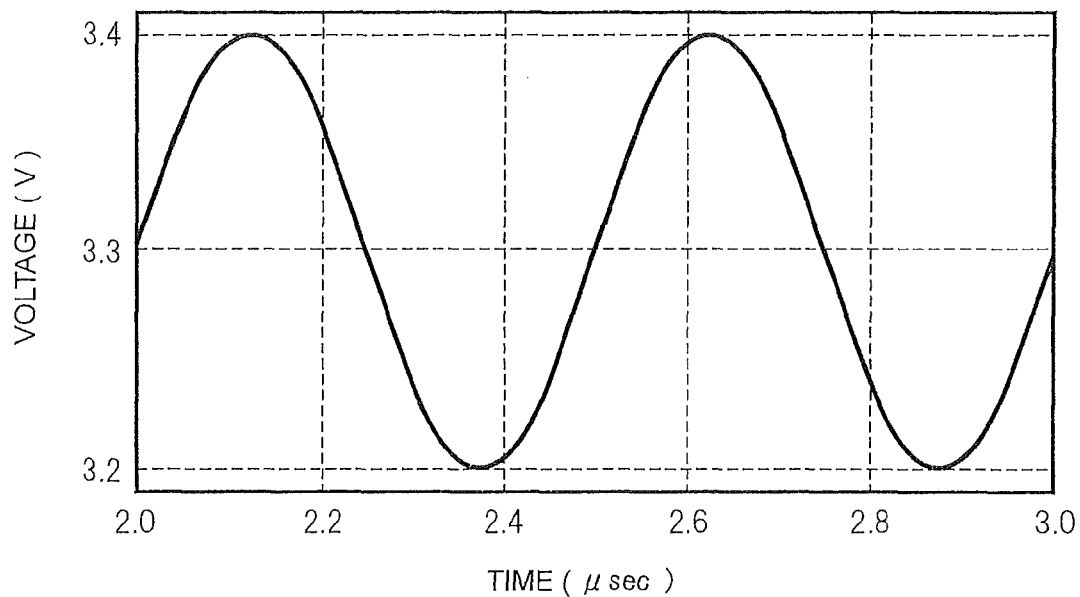
FIG. 7A illustrates a waveform of a power source voltage.
Figure 7B:
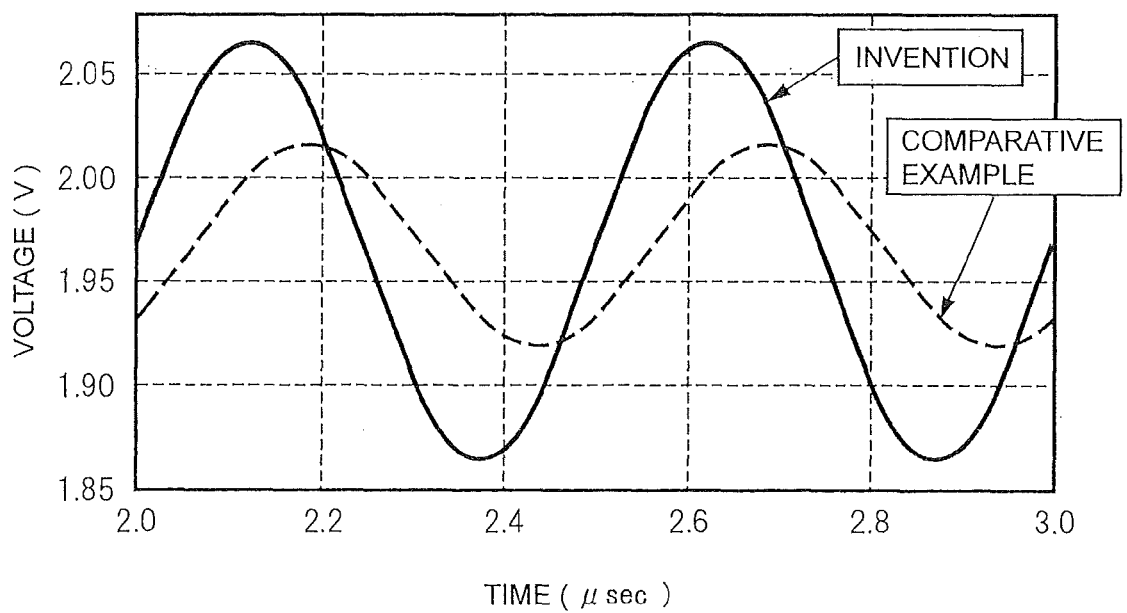
FIG. 7B shows a voltage change in the reference voltage supply circuit according to the second embodiment of the present invention and another voltage change in the reference voltage supply circuit of Comparative Example.

FIG. 7A shows the change of the power supply voltage $V_{dd}$. FIG. 7B includes two waveforms. One waveform shows voltage changes at the node T4 in the reference voltage supply circuit 20 according to the second embodiment, and another waveform shows voltage changes at the node T4 in the reference voltage supply circuit of Comparative Example. In each of FIGS. 7A and 7B, the horizontal axis indicates time (microseconds: μec), and the vertical axis indicates voltage (V). Curves in FIGS. 7A and 7B were obtained from simulations at a frequency of 2 MHz. In FIG. 7B, the curve derived from the reference voltage supply circuit 20 is shown by the solid line, and the curve derived from Comparative Example is shown by the broken line.

As seen from FIGS. 7A and 7B, in the reference voltage supply circuit 20, the power supply voltage $V_{dd}$ and the voltage at the node T4 reach their maximum voltages (3.4 V and 2.08 V, respectively) at the same times, namely at about 2.15 μsec and about 2.63 μec. In the reference voltage supply circuit 20, the power supply voltage $V_{dd}$ and the voltage at the node T4 reach their minimum voltages (3.2 V and 1.87 V, respectively) at the same times, namely at about 2.38 μsec and about 2.88 μsec. In contrast, in Comparative Example, the voltage at the node T4 reaches its maximum voltage (2.02 V) at about 2.2 μsec and about 2.7 μsec, and reaches its minimum voltage (1.93 V) at about 2.45 μsec and about 2.95 μsec. All these times are different from the corresponding times of the power supply voltage $V_{dd}$. In the reference voltage supply circuit 20 of the second embodiment, the voltage change at the node T4 is in phase with the change of the power supply voltage $V_{dd}$. In the reference voltage supply circuit of Comparative Example, the voltage change at the node T4 is delayed in phase with respect to the change of the power supply voltage $V_{dd}$.

Figure 8A:
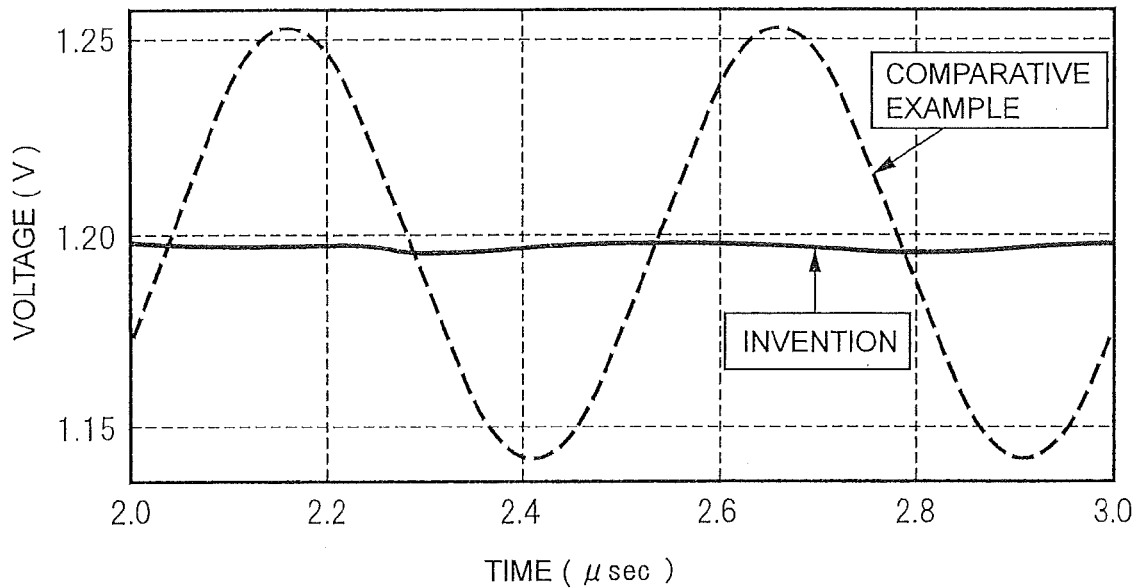
FIG. 8A shows the changes of an output voltage in the reference voltage supply circuit according to the second embodiment of the present invention and in the reference voltage supply circuit of Comparative Example.
Figure 8B:
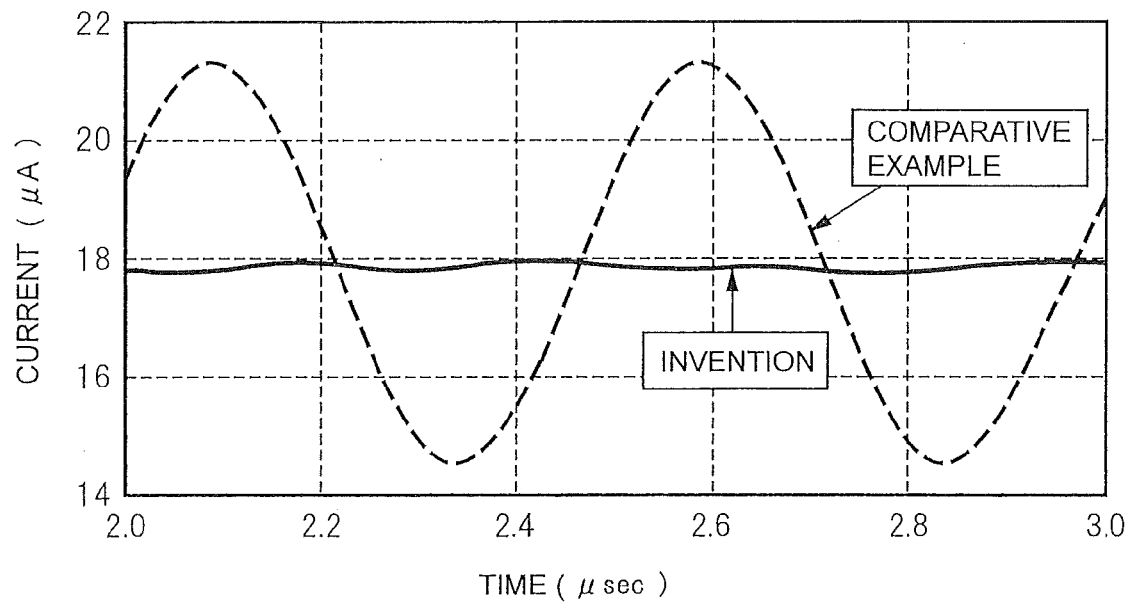
FIG. 8B shows the changes of the drain-to-source current of an output element in the reference voltage supply circuit according to the second embodiment of the present invention and in the reference voltage supply circuit of Comparative Example.

FIG. 8A shows the voltage changes of the output voltage $V_{out}$ in the reference voltage supply circuit 20 according to the second embodiment and in the reference voltage supply circuit of Comparative Example. FIG. 8B shows the changes of the drain-to-source current of the transistor P5 in the reference voltage supply circuit 20 of the second embodiment and in the reference voltage supply circuit of Comparative Example. In each of FIGS. 8A and 8B, the horizontal axis indicates time (microseconds: μec), and the vertical axis indicates voltage (V) or current (μA). Simulations were conducted at a frequency of 2 MHz to obtain the curves shown in FIGS. 8A and 8B.

As shown in FIG. 8A, in the reference voltage supply circuit 20 according to the second embodiment, the output voltage $V_{out}$ is substantially kept at a constant level that is about 1.20 V. In Comparative Example, the output voltage $V_{out}$ changes in a cycle (or changes periodically) in a range of from about 1.14 V to about 1.26 V. As shown in FIG. 8B, in the reference voltage supply circuit 20 according to the second embodiment, the drain-to-source current of the transistor P5 is substantially kept at a constant level that is about 18 μA. In Comparative Example, the drain-to-source current of the transistor P5 changes in a cycle in a range of from about 15 μA to about 121 μA. It was therefore confirmed that the reference voltage supply circuit 20 according to the second embodiment can generate and supply the output voltage $V_{out}$ more stably than Comparative Example.

In Comparative Example, generation of the gate-to-drain voltage (voltage ($V_{T4}-V_{out}$)) of the transistor P5 is delayed in phase with respect to the change of the drain-to-source voltage (voltage ($V_{dd}-V_{out}$)) of the transistor P5. This creates a potential difference between the drain-to-source voltage and the gate-to-drain voltage, thereby changing the drain-to-source current of the transistor P5. Upon this changing, the output voltage $V_{out}$ also changes so that the power supply rejection ratio of Comparative Example deteriorates.

In contrast, in the reference voltage supply circuit 20 of the second embodiment, the gate-to-drain voltage (voltage ($V_{T4}-V_{out}$)) of the transistor P5 is in phase with the change of the drain-to-source voltage (voltage ($V_{dd}-V_{out}$)) of the transistor P5. A potential difference between the drain-to-source voltage and the gate-to-drain voltage changes with a fixed voltage discrepancy. Thus, the gate voltage of the transistor P5 is seemingly (namely, relatively) kept at a fixed value, and there is substantially no change in the drain-to-source current of the transistor P5. As a result, in the reference voltage supply circuit 20 of the second embodiment, the output voltage $V_{out}$ is maintained at a fixed level and a power supply rejection ratio is improved.

FIG. 9 depicts the curves of power supply rejection ratios of the reference voltage supply circuit 20 of the second embodiment and the reference voltage supply circuit of Comparative Example. In FIG. 9, the horizontal axis indicates a frequency (Hz) and the vertical axis indicates a gain (dBV). The horizontal axis is plotted on a logarithmic scale. The curves shown in FIG. 9 are drawn based on simulation obtained from the reference voltage supply circuit 20 of the second embodiment and the reference voltage supply circuit of Comparative Example.

As shown in FIG. 9, in the reference voltage supply circuit 20 according to the second embodiment, a constant gain of about −78 dBV can be obtained at about 20 kHz or lower frequencies. In Comparative Example, a constant gain of about −78 dBV is obtained in a region narrower than the region of the second embodiment that ranges only up to about 30 Hz. This means that the reference voltage supply circuit 20 according to the second embodiment achieves a stable gain in a wider frequency band than that of Comparative Example, and the reference voltage supply circuit 20 according to the second embodiment can supply the output voltage $V_{out}$ more stably than Comparative Example. The reference voltage supply circuit 20 achieves a relatively high gain of about −72 dBV at 100 kHz whereas the reference voltage supply circuit of Comparative Example achieves a relatively low gain of about −15 dBV at 100 kHz. The reference voltage supply circuit 20 of the second embodiment achieves a relatively high gain of about −53 dBV at 1 MHz whereas the reference voltage supply circuit of Comparative Example achieves a relatively low gain of about −5 dBV at 1 MHz. Accordingly, it was confirmed that the reference voltage supply circuit 20 of the second embodiment achieves a gain even in a high-frequency region higher than a gain conventionally achieved.

This application is based on Japanese Patent Application No. 2010-169387 filed on Jul. 28, 2010, and the entire disclosure thereof is incorporated herein by reference.

What is claimed is:

1. A differential amplifier circuit comprising:
 a power supply line connected to a power supply voltage source;
 an input part including an input circuit and an active load, the input circuit having two differential input elements, the active load having two transistors connected to the two differential input elements, respectively, the input part generating a differential signal in response to an input signal given to each of the two differential input elements;
 an amplifying part for generating an output voltage generating signal by amplifying the differential signal; an output part for generating an output voltage on the basis of the output voltage generating signal supplied from the amplifying part and a power supply voltage supplied from the power supply voltage source; and
 a noise permitting part connected between respective control terminals of the two transistors and the power supply line for permitting only a noise component of the power supply voltage to pass from the power supply line to the control terminals of the two transistors so as to drive the active load with the noise component.

2. The differential amplifier circuit according to claim 1, wherein the noise permitting part includes a capacitor.

3. The differential amplifier circuit according to claim 2, wherein the capacitor is connected to each of the control terminals of the two transistors.

4. The differential amplifier circuit according to claim 1, wherein the noise permitting part includes a first capacitor and a second capacitor, the first capacitor being connected to the control terminal of one of the two transistors, the second capacitor being connected to the control terminal of the other of the two transistors.

5. The differential amplifier circuit according to claim 1, wherein the output part includes an output transistor and a voltage divider circuit connected to the output transistor, the output transistor generating the output voltage in response to the output voltage generating signal, and the voltage divider circuit supplying a feedback output signal to one of the differential input elements of the input circuit.

6. The differential amplifier circuit according to claim 5, wherein the output part includes a secondary output transistor and a secondary voltage divider circuit connected to the secondary output transistor, the secondary output transistor being connected in parallel with the output transistor, and the secondary voltage divider circuit supplying a secondary feedback output signal to the other of the differential input elements of the input circuit.

7. The differential amplifier circuit according to claim 5, wherein the output part includes a secondary voltage divider circuit connected to the output transistor such that the secondary voltage divider circuit is connected in parallel with the voltage divider circuit, and a secondary feedback output signal is supplied from the secondary voltage divider circuit to the other of the differential input elements of the input circuit.

8. The differential amplifier circuit according to claim 1, wherein the active load includes a current mirror circuit.

9. The differential amplifier circuit according to claim 1, wherein the input circuit includes two p-channel MOS transistors.

10. The differential amplifier circuit according to claim 9, wherein the two transistors of the active load are n-channel MOS transistors.

11. The differential amplifier circuit according to claim 9, wherein the two transistors of the active load are bipolar transistors.

12. The differential amplifier circuit according to claim 1, wherein the noise permitting part allows an alternating current component to pass therethrough and prohibits a direct current component from passing therethrough.

13. The differential amplifier circuit according to claim 2, wherein a capacitance of the capacitor is decided based on at least the output voltage and a power supply rejection ratio of the differential amplifier circuit.

14. The differential amplifier circuit according to claim 2, wherein a capacitance of the capacitor is 0.1 pF or more.

15. The differential amplifier circuit according to claim 1, wherein the input part has a third transistor, a source terminal of the third transistor is connected to the power supply line, a drain terminal of the third transistor is connected to source terminals of the two differential input elements, and a gate terminal of the third transistor receives a reference voltage current to define a reference current that flows in the input part.

16. The differential amplifier circuit according to claim 1, wherein the noise permitting part includes a plurality of capacitors.

17. A differentiating or integrating circuit that includes a differential amplifier circuit of claim 1.

18. An adding circuit that includes a differential amplifier circuit of claim 1.

* * * * *